US010862497B1

(12) United States Patent
Lin

(10) Patent No.: US 10,862,497 B1
(45) Date of Patent: Dec. 8, 2020

(54) SUCCESSIVE APPROXIMATION ANALOG-TO-DIGITAL CONVERTER AND OPERATION METHOD THEREOF

(71) Applicant: REALTEK SEMICONDUCTOR CORPORATION, Hsinchu (TW)

(72) Inventor: Sheng-Hsiung Lin, Tainan (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 16/815,593

(22) Filed: Mar. 11, 2020

(30) Foreign Application Priority Data

Jun. 14, 2019 (TW) .............................. 108120683 A

(51) Int. Cl.
H03M 1/12 (2006.01)
H03M 1/46 (2006.01)

(52) U.S. Cl.
CPC ......... *H03M 1/466* (2013.01); *H03M 1/1245* (2013.01); *H03M 1/462* (2013.01)

(58) Field of Classification Search
CPC ...... H03M 1/468; H03M 1/466; H03M 1/462; H03M 1/1245; H03M 1/38; H03M 1/804; H03M 1/46; H03M 1/08; H03M 1/1009; H03M 1/002; H03M 1/12; H03M 1/68; H03M 1/0617; H03M 1/0863; H03M 1/124; H03M 1/802; H03M 1/1023;
(Continued)

(56) References Cited

U.S. PATENT DOCUMENTS 8,933,830 B1 * 1/2015 Jeon ..................... H03M 1/1023
341/110
9,531,400 B1 * 12/2016 Wen ......................... H03M 1/38
9,998,131 B1 * 6/2018 Kinyua ................. H03M 1/164
(Continued)

FOREIGN PATENT DOCUMENTS

TW I638528 10/2018

OTHER PUBLICATIONS

W. Tseng, W. Lee, C. Huang and P. Chiu, "A 12-bit 104-MS/s SAR ADC in 28nm CMOS for digitally-assisted wireless transmitters," 2015 IEEE Asian Solid-State Circuits Conference (A-SSCC), Xiamen, 2015, pp. 1-4.

(Continued)

*Primary Examiner* — Linh V Nguyen
(74) *Attorney, Agent, or Firm* — WPAT, PC

(57) ABSTRACT

A successive approximation analog-to-digital converter (SAR ADC) and an operation method thereof are provided. The SAR ADC, which alternately operates in a sampling phase and a comparison and switching phase, includes a switch-capacitor digital-to-analog converter (DAC), a comparator, a successive approximation register and a control circuit. The switch-capacitor DAC including multiple capacitors. The control circuit is configured to (A) control a top plate of a first capacitor and a top plate of a second capacitor to be coupled to an analog input signal during the sampling phase; (B) control the first capacitor and the second capacitor to be active and inactive, respectively, in the comparison and switching phase according to a reference code after the sampling phase finishes; and (C) switch a terminal voltage of at least one of the capacitors during the comparison and switching phase according to the comparison results of the comparator.

20 Claims, 11 Drawing Sheets

(58) Field of Classification Search
CPC .. H03M 1/0607; H03M 1/1071; H03M 3/426; H03M 1/0612; H03M 1/0682
USPC .......................... 341/155, 161, 162, 172, 150
See application file for complete search history.

(56) References Cited

U.S. PATENT DOCUMENTS

| | | | |
|---|---|---|---|
| 10,097,198 B1* | 10/2018 | Lee | H03M 1/466 |
| 10,498,349 B2* | 12/2019 | Huang | H03M 1/125 |
| 2012/0280841 A1* | 11/2012 | Wang | H03M 1/1295 341/110 |
| 2015/0180498 A1* | 6/2015 | Yang | H03M 1/1057 341/120 |
| 2015/0263756 A1* | 9/2015 | Chiu | H03M 1/0607 341/118 |
| 2016/0254821 A1* | 9/2016 | Luo | H03M 1/125 341/161 |
| 2017/0033800 A1* | 2/2017 | Yuan | H03M 1/1245 |
| 2017/0244424 A1* | 8/2017 | Liu | H03M 1/54 |
| 2019/0068179 A1 | 2/2019 | Chen et al. | |
| 2019/0131986 A1* | 5/2019 | Vinje | H03M 1/1023 |

OTHER PUBLICATIONS

Y. Lin, C. Liu, G. Huang, Y. Shyu, Y. Liu and S. Chang, "A 9-Bit 150-MS/s Subrange ADC Based on SAR Architecture in 90-nm CMOS," in IEEE Transactions on Circuits and Systems I: Regular Papers, vol. 60, No. 3, pp. 570-581, Mar. 2013.

* cited by examiner

S432 — controlling the top plate(s) of one or some of the capacitors to be coupled to the comparator, and controlling the top plate(s) of one or some of the capacitors not to be coupled to the comparator

FIG. 10A

S434 — controlling the bottom plate(s) of one or some of the capacitors not to be floating, and controlling the bottom plate(s) of one or some of the capacitors to be floating

FIG. 10B

SUCCESSIVE APPROXIMATION ANALOG-TO-DIGITAL CONVERTER AND OPERATION METHOD THEREOF

BACKGROUND OF THE INVENTION

1. Field of the Invention

The present invention generally relates to successive approximation analog-to-digital converters (SAR ADCs), and, more particularly, to SAR ADCs employing a switch-capacitor digital-to-analog converter (DAC).

2. Description of Related Art

In the following description, two ends of a capacitor are defined as a top plate and a bottom plate, respectively; the top plate refers to the end coupled to the comparator or amplifier, whereas the bottom plate refers to the end not coupled to the comparator or amplifier. Such definition is made only for the ease of discussion and not necessarily related to the "top" and "bottom" in the actual circuit.

A SAR ADC usually includes a comparator and a switch-capacitor digital-to-analog converter (DAC). FIG. 1 shows the comparator 105 and the internal circuit of the conventional switch-capacitor DAC 110. The switch-capacitor DAC 110 includes two capacitor arrays, each of which contains n capacitors (C1 to Cn or C1' to Cn') and n switches (SW1 to SWn or SW1' to SWn') (n is a positive integer). The switch SWk (or SWk') switches the terminal voltage of the bottom plate of the capacitor Ck (or Ck') according to the control signal Gk (or #Gk) (k is an integer and $1 \leq k \leq n$). FIG. 1 also shows that the analog input signal Vi is a differential signal which is composed of signals Vip and Vin, and the switches SWip and SWin are utilized to sample the analog input signal Vi. The capacitors C1 and C1' correspond to the most significant bit (MSB), and the capacitors Cn and Cn' correspond to the least significant bit (LSB), which implies that the capacitance values decrease from the capacitors C1 and C1' toward the capacitors Cn and Cn' (e.g., decreasing in a binary progression). A capacitor pair (i.e., the capacitors Ck and Ck') includes two capacitors having substantially the same capacitance value. In the comparison and switching phase of the SAR ADC (i.e., after the sampling phase finishes, and the switches SWip and SWin are switched off), when the $k^{th}$ comparison phase ends and the $k^{th}$ switching phase starts, the control signal #Gk is the inversion of the control signal Gk, meaning that when the switch SWk is switched to the reference voltage Vref1, the switch SWk' is switched to the reference voltage Vref2, and that when the switch SWk is switched to the reference voltage Vref2, the switch SWk' is switched to the reference voltage Vref1.

Because the switches SWk and SWk' are usually each implemented by an inverter which includes a P-type Metal-Oxide-Semiconductor Field-Effect Transistor (MOSFET) (hereinafter referred to as PMOS) and an N-type MOSFET (hereinafter referred to as NMOS), and the equivalent impedance of the PMOS often does not match that of the NMOS, the impedance values seen by the positive and negative input terminals of the comparator 105 are related to the digital code outputted by the SAR ADC. Such impedance mismatch causes errors to the SAR ADC or leads to poor signal-to-noise and distortion ratio (SNDR). For more details about impedance matching, please refer to the U.S. Patent Publication No: US 2019-0068179 A1.

SUMMARY OF THE INVENTION

In view of the issues of the prior art, an object of the present invention is to provide successive approximation analog-to-digital converters (SAR ADCs) and operation methods thereof, so as to improve the performance of the SAR ADCs.

A successive approximation analog-to-digital converter (SAR ADC) is provided. The SAR ADC alternately operates in a sampling phase and a comparison and switching phase and is configured to convert an analog input signal into a digital code. The SAR ADC includes a switch-capacitor digital-to-analog converter (DAC), a comparator, a successive approximation register (SAR) and a control circuit. The switch-capacitor DAC includes multiple capacitors and is configured to sample the analog input signal in the sampling phase. The capacitors include a first capacitor and a second capacitor which are substantially the same in capacitance value. A bottom plate of the first capacitor and a bottom plate of the second capacitor are coupled to different reference voltages. The comparator is coupled to the switch-capacitor DAC and configured to compare outputs of the switch-capacitor DAC in the comparison and switching phase to generate multiple comparison results. The SAR is coupled to the comparator and configured to store the comparison results. The comparison results constitute the digital code. The control circuit is coupled to the SAR and the switch-capacitor DAC and configured to: (A) in the sampling phase, control a top plate of the first capacitor and a top plate of the second capacitor to be coupled to the analog input signal; (B) after the sampling phase finishes, refer to a reference code to control the first capacitor to be active in the comparison and switching phase and to control the second capacitor to be inactive in the comparison and switching phase; and (C) in the comparison and switching phase, switch a terminal voltage of at least one of the capacitors according to the comparison results.

A method of operating a successive approximation analog-to-digital converter (SAR ADC) is also provided. The SAR ADC alternately operates in a sampling phase and a comparison and switching phase to convert an analog input signal into a digital code and includes a switch-capacitor digital-to-analog converter (DAC) and a comparator. The switch-capacitor DAC includes multiple capacitors which include a first capacitor and a second capacitor. The method includes the following steps: (A) in the sampling phase, controlling a top plate of the first capacitor and a top plate of the second capacitor to be coupled to the analog input signal, wherein the first capacitor and the second capacitor are substantially the same in capacitance value, and a bottom plate of the first capacitor and a bottom plate of the second capacitor are coupled to different reference voltages; (B) after the sampling phase finishes, referring to a reference code to control the first capacitor to be active in the comparison and switching phase and to control the second capacitor to be inactive in the comparison and switching phase; (C) the comparator comparing outputs of the switch-capacitor DAC to obtain multiple comparison results, wherein the comparison results constitute the digital code; and (D) switching a terminal voltage of at least one of the capacitors according to the comparison results.

According to the present invention, the SAR ADCs and the operation methods thereof can improve the impedance matching between the positive and negative input terminals of the comparator. Compared with the conventional technology, the present invention can improve the performance of the SAR ADCs.

These and other objectives of the present invention no doubt become obvious to those of ordinary skill in the art

BRIEF DESCRIPTION OF THE DRAWINGS

FIGS. 10A to 10B are sub-steps of step S430 of FIG. 4.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes successive approximation analog-to-digital converters (SAR ADCs) and operation methods thereof. On account of that some or all elements of the SAR ADCs could be known, the detail of such elements is omitted provided that such detail has little to do with the features of this disclosure, and that this omission nowhere dissatisfies the specification and enablement requirements. Some or all of the processes of the operation methods of the SAR ADCs may be performed by the SAR ADCs or their equivalents. A person having ordinary skill in the art can choose components or steps equivalent to those described in this specification to carry out the present invention, which means that the scope of this invention is not limited to the embodiments in the specification.

Figure 1:
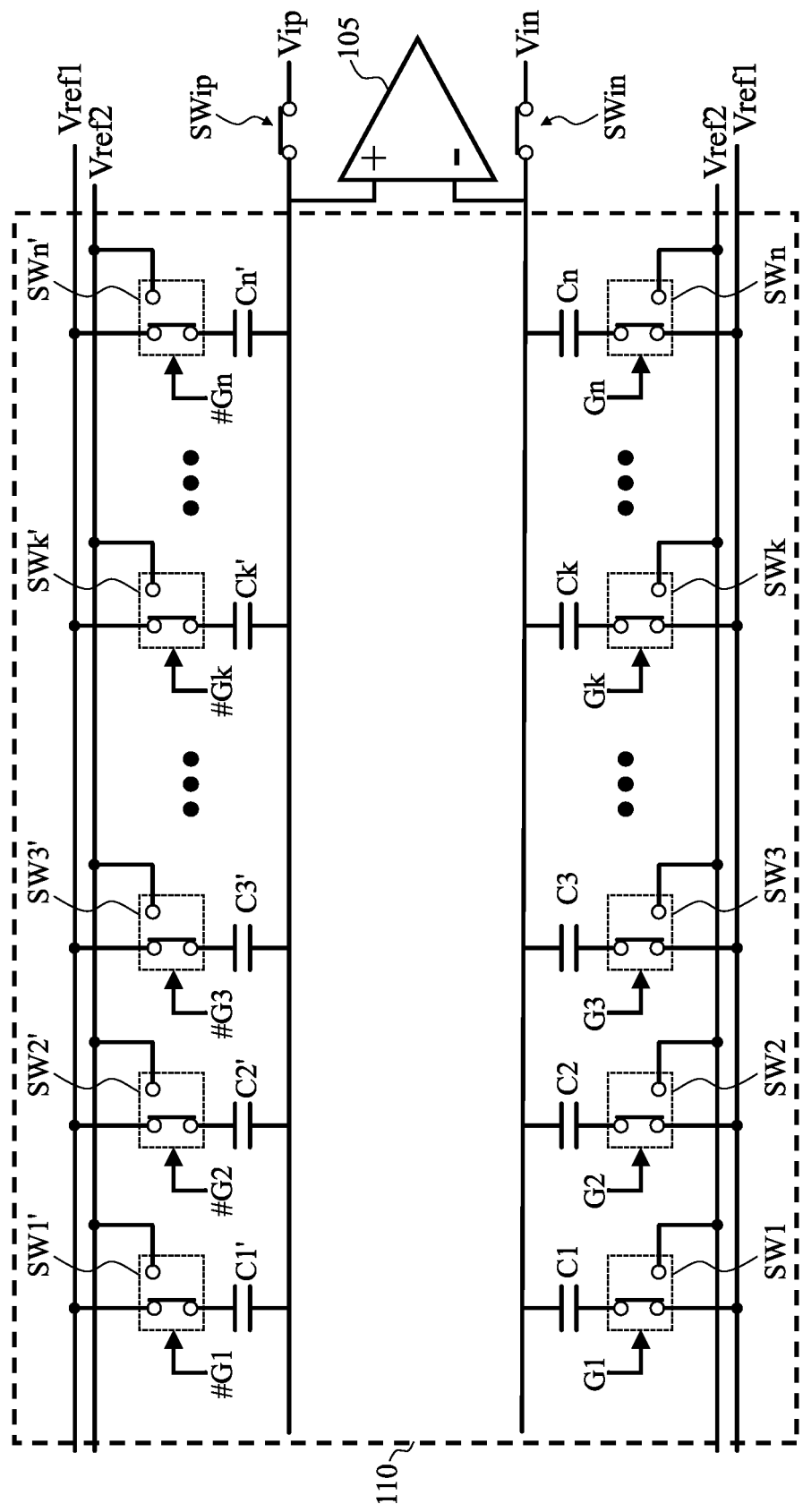
FIG. 1 illustrates the comparator and the internal circuit of the conventional switch-capacitor DAC.
Figure 2:
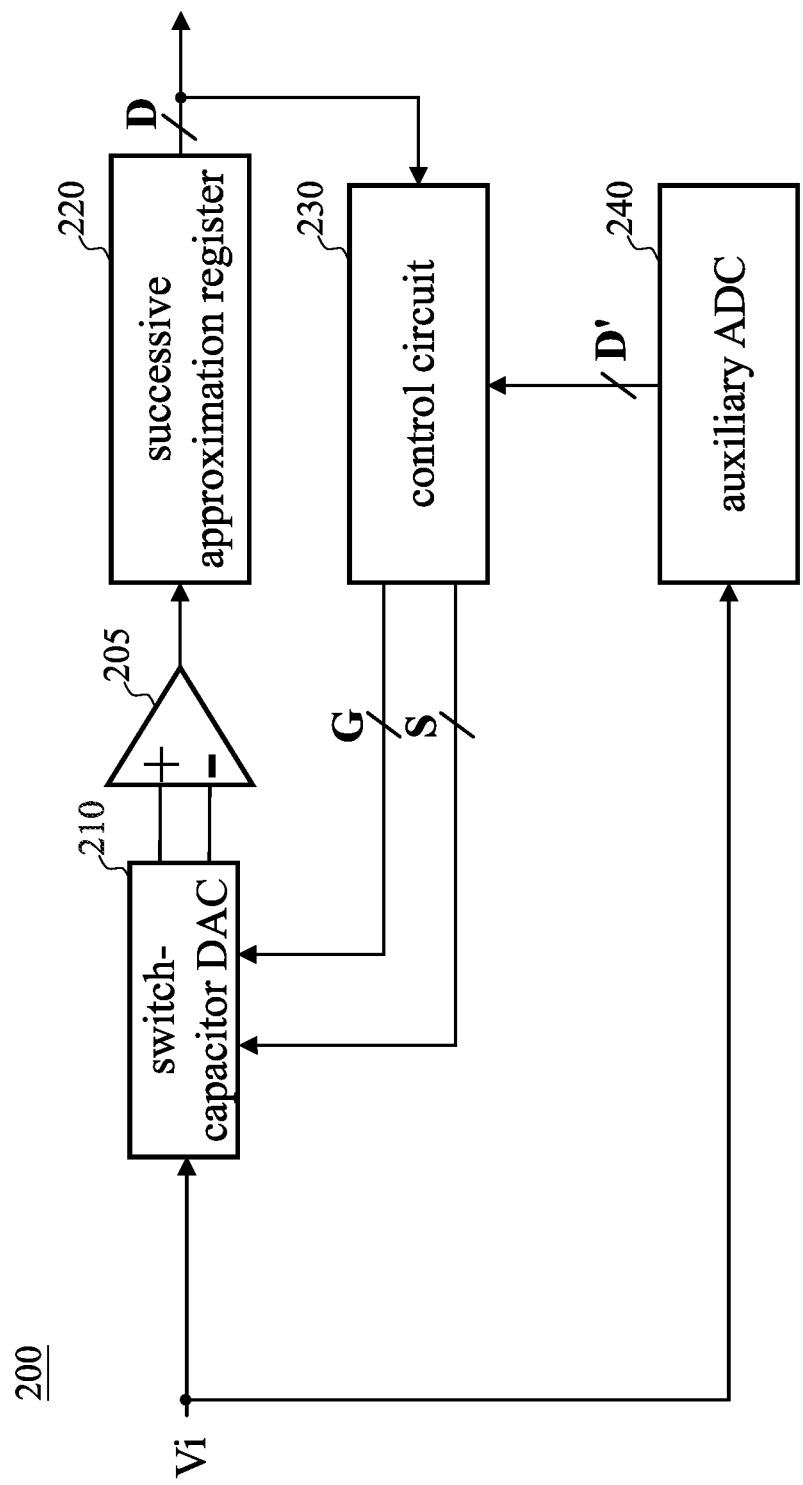
FIG. 2 illustrates a functional block diagram of a SAR ADC according to an embodiment of the present invention.
Figure 3:
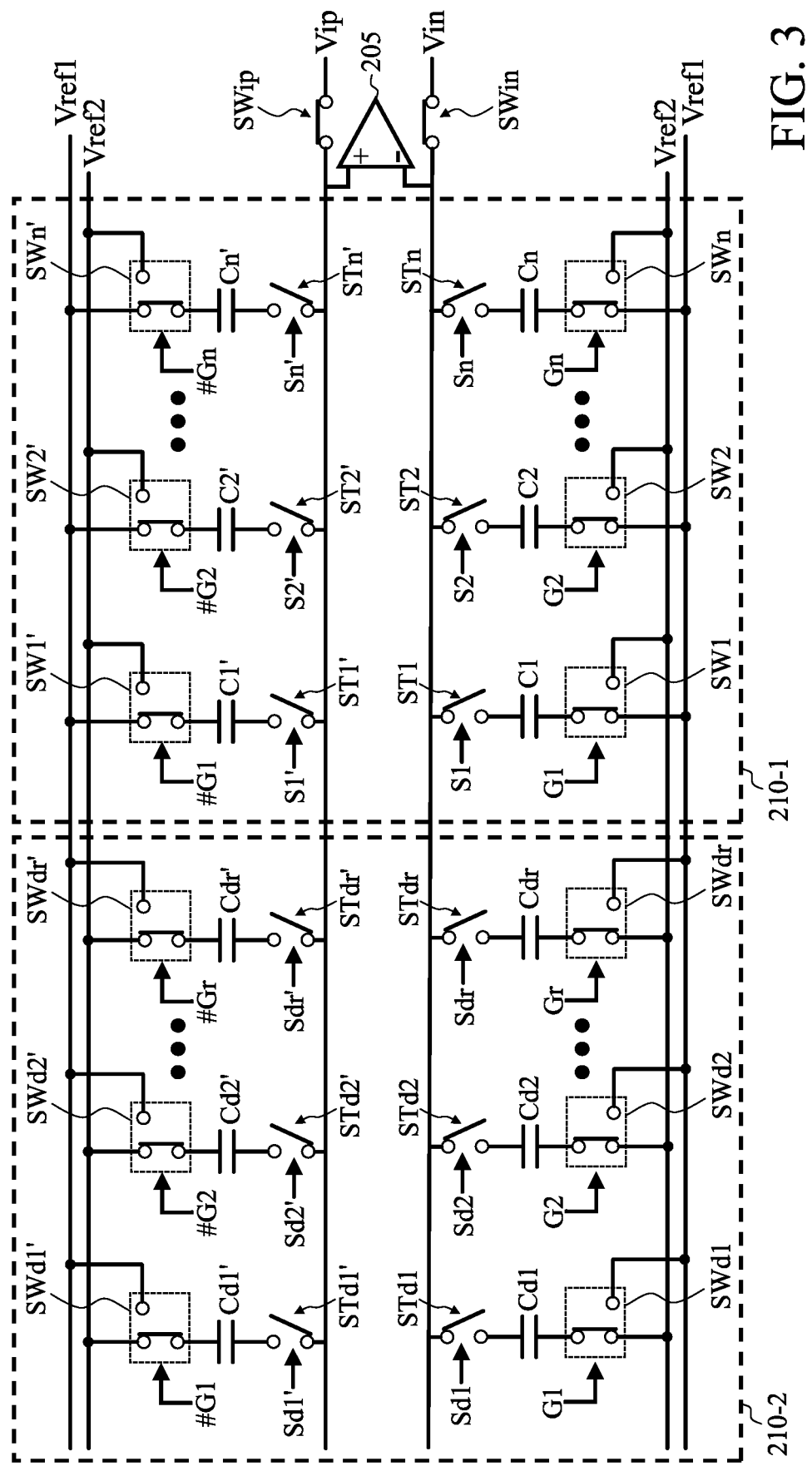
FIG. 3 illustrates an embodiment of the internal circuit of the switch-capacitor DAC in FIG. 2.

FIG. 2 is a functional block diagram of a SAR ADC according to an embodiment of the present invention. The SAR ADC 200 includes a comparator 205, a switch-capacitor DAC 210, a successive approximation register 220, a control circuit 230 and an auxiliary ADC 240. FIG. 3 shows an embodiment of the internal circuit of the switch-capacitor DAC 210 in FIG. 2. The control circuit 230 controls the switch-capacitor DAC 210 through a control signal G (including the control signals Gk and #Gk in FIG. 3) and a control signal S (including the control signals S1 to Sn, S1' to Sn', Sd1 to Sdr and Sd1' to Sdr' in FIG. 3). The switch-capacitor DAC 210 includes a first capacitor array 210-1 and a second capacitor array 210-2. The first capacitor array 210-1 is similar to the switch-capacitor DAC 110, except that the top plates of the capacitors Ck and Ck' of the first capacitor array 210-1 are coupled to the comparator 205 through the switches STk and STk', respectively. The switch STk is controlled by the control signal Sk, and the switch STk' is controlled by the control signal Sk'.

The second capacitor array 210-2 includes two sub-arrays. The lower sub-array (i.e., the sub-array coupled to the switch SWin) includes r capacitors Cd1 to Cdr, r first switches SWd1 to SWdr and r second switches STd1 to STdr (r is an integer and $1 \leq r \leq n$). The first switch SWdj is controlled by the control signal Gj ($1 \leq j \leq r$), and the second switch STdj is controlled by the control signal Sdj. Similarly, the upper sub-array (i.e., the sub-array coupled to the switch SWip) includes r capacitors Cd1' to Cdr', r first switches SWd1' to SWdr' and r second switches STd1' to STdr'. The first switch SWdj' is controlled by the control signal #Gj, and the second switch STdj' is controlled by the control signal Sdj'.

The capacitance values of the capacitors Cj, Cj', Cdj and Cdj' are substantially the same. When the switch-capacitor DAC 210 samples the analog input signal Vi, the bottom plates of the capacitors Cj and Cdj are coupled to different reference voltages, and the bottom plates of the capacitors Cj' and Cdj' are coupled to different reference voltages. More specifically, if the bottom plate of the capacitor Cj is coupled to the reference voltage Vref1, the bottom plate of the capacitor Cdj is coupled to the reference voltage Vref2. If the bottom plate of the capacitor Cj is coupled to the reference voltage Vref2, the bottom plate of the capacitor Cdj is coupled to the reference voltage Vref1. The same operation applies to the capacitors Cj' and Cdj'. The reference voltage Vref1 is different from the reference voltage Vref2.

Figure 4:
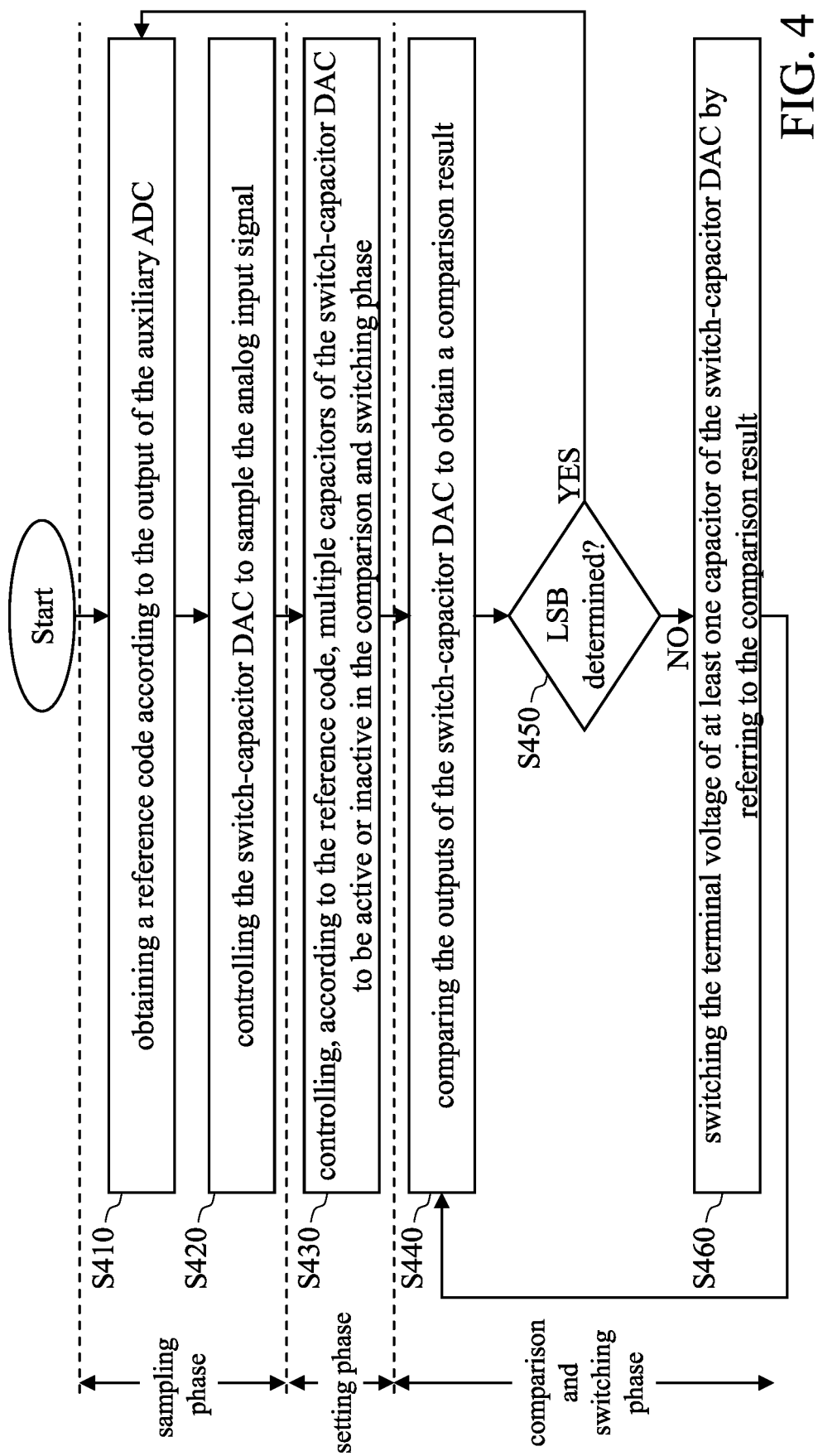
FIG. 4 illustrates a flowchart of an operation method of a SAR ADC according to an embodiment of the present invention.

FIG. 4 is a flowchart of an operation method of a SAR ADC according to an embodiment of the present invention. The SAR ADC of the present invention operates in order in the sampling phase, the setting phase, and the comparison and switching phase. In the sampling phase, the auxiliary ADC 240 converts the analog input signal Vi into a digital code D', and the control circuit 230 uses the digital code D' or a part of the digital code D' as a reference code (the number of bits of the reference code is r) (step S410) and controls the switch-capacitor DAC 210 to sample the analog input signal Vi (step S420). Step S410 and step S420 can be performed simultaneously. In step S420, the control circuit 230 controls the switches SWin and SWip to switch on and controls the switches ST1 to STn, ST1' to STn', STd1 to STdr and STd1' to STdr' to switch on through the control signal S, so that the top plates of the capacitors C1 to Cn, C1' to Cn', Cd1 to Cdr and Cd1' to Cdr' are coupled to the analog input signal Vi (in this instance, the top plates of the capacitors C1 to Cn and Cd1 to Cdr receive the signal Vin, while the top plates of the capacitors C1' to Cn' and Cd1' to Cdr' receive the signal Vip).

In the setting phase, the control circuit 230 configures the switch-capacitor DAC 210. More specifically, the control circuit 230 controls, based on the reference code, multiple capacitors of the switch-capacitor DAC 210 to be active or inactive in the comparison and switching phase (step S430). When a certain capacitor is active in the comparison and switching phase, the top plate of that same capacitor is coupled to the input terminal of the comparator 205, and the bottom plate of that same capacitor is coupled to the reference voltage Vref1 or the reference voltage Vref2. When, on the other hand, a certain capacitor is inactive in the comparison and switching phase, the top plate of that same capacitor is not coupled to the input terminal of the comparator 205, or the bottom plate of that same capacitor is floating. In other words, the capacitors which are active in the comparison and switching phase practically participate in this phase so that the voltages across these capacitors change during this phase, whereas the capacitors which are inactive in the comparison and switching phase do not participate in this phase so that the voltages across these capacitors remain the same during this phase.

Therefore, step S430 can be implemented by the following two methods which correspond to sub-step S432 in FIG. 10A and sub-step S434 in FIG. 10B, respectively. In method one, in accordance with the reference code (e.g., by referring to the reference code), the control circuit 230 controls the top plate of one capacitor of the capacitor pair (Cj and Cdj) to be coupled to the comparator 205 and controls the top plate of the other capacitor not to be coupled to the comparator 205, as well as controls the top plate of one capacitor of the capacitor pair (Cj' and Cdj') to be coupled to the comparator 205 and controls the top plate of the other capacitor not to be coupled to the comparator 205. In method two, in accordance with the reference code (e.g., by referring to the reference code), the control circuit 230 controls the top plates of both capacitors of the capacitor pair (Cj and Cdj) to be coupled to the comparator 205 and controls the bottom plate of only one of the two capacitors to be floating, as well as controls the top plates of both capacitors of the capacitor pair (Cj' and Cdj') to be coupled to the comparator 205 and controls the bottom plate of only one of the two capacitors to be floating. More specifically, in method one, the control circuit 230 controls one of the switches STj and STdj to switch on and the other to switch off and controls one of the control switches STj' and STdj' to switch on and the other to switch off. In method two, the control circuit 230 controls the switches STj, STdj, STj' and STdj' to switch on, controls the bottom plate of one capacitor of the capacitor pair (Cj and Cdj) to be floating, and controls the bottom plate of one capacitor of the capacitor pair (Cj' and Cdj') to be floating. In method one, after step S430 is completed, the switching state of the switch STj is the same as that of the switch STdj' (i.e., both switched on or off), and the switching state of the switch STj' is the same as that of the switch STdj.

For example, considering a case where the reference code is a 2-bit code represented by $b_1 b_2$ (i.e., r=2, the number of bits of the digital code D' being greater than or equal to 2, and b1 being the MSB), in method one, the control circuit 230 controls the switches ST1, STd1, ST1' and STd1' to switch on or off according to the bit b1 and controls the switches ST2, STd2, ST2' and STd2' to switch on or off according to the bit b2. For that same case, in method two, the control circuit 230 controls the bottom plates of the capacitors C1, Cd1, C1' and Cd1' to be floating or not according to the bit b1 and controls the bottom plates of the capacitors C2, Cd2, C2' and Cd2' to be floating or not according to the bit b2.

The above example can be further illustrated in a more specific manner by assuming that the reference code $b_1 b_2$ is 01 and the reference voltage Vref1 is greater than the reference voltage Vref2. In method one, in step S430, the control circuit 230 controls the switches ST1 and STd1' to switch on and the switches ST1' and STd1 to switch off and controls the switches ST2 and STd2' to switch off and the switches ST2' and STd2 to switch on. In method two, in step S430, the control circuit 230 controls the bottom plates of the capacitors C1 and Cd1' not to be floating and the bottom plates of the capacitors C1' and Cd1 to be floating and controls the bottom plates of the capacitors C2 and Cd2' to be floating and the bottom plates of the capacitors C2' and Cd2 not to be floating. In other words, upon the setting phase is completed, the bottom plates of the r active capacitors coupled to the positive terminal of the comparator 205 and the bottom plates of the r active capacitors coupled to the negative terminal of the comparator 205 are coupled to the same reference voltage. As a result, the impedance matching between the positive and negative input terminals of the comparator 205 is excellent.

After the setting phase ends, the SAR ADC 200 enters the comparison and switching phase, and the comparator 205 compares the outputs of the switch-capacitor DAC 210 in this phase to generate a comparison result (step S440). The comparison result is one bit of the digital code D and is stored in the successive approximation register 220. If the comparison result corresponds to the LSB of the digital code D (YES branch of step S450, meaning that the digital code D has just been determined), the flow returns to step S410. If, on the other hand, the result of step S450 is NO, the control circuit 230 switches the terminal voltage of at least one capacitor of the first capacitor array 210-1 by referring to the comparison result (equivalent to referring to the digital code D) in the comparison and switching phase (step S460). Please note that when performing step S460, the control circuit 230 switches the terminal voltage (from Vref1 to Vref2) of the bottom plate of only one capacitor of a capacitor pair (e.g., the capacitors Ck and Ck'). After step S460 is completed, the charges on the capacitors of the switch-capacitor DAC 210 are redistributed, and the comparator 205 proceeds to generate the next comparison result (i.e., determining the next bit of the current digital code D) according to the outputs of the switch-capacitor DAC 210 in the comparison and switching phase (step S440).

Figure 5:
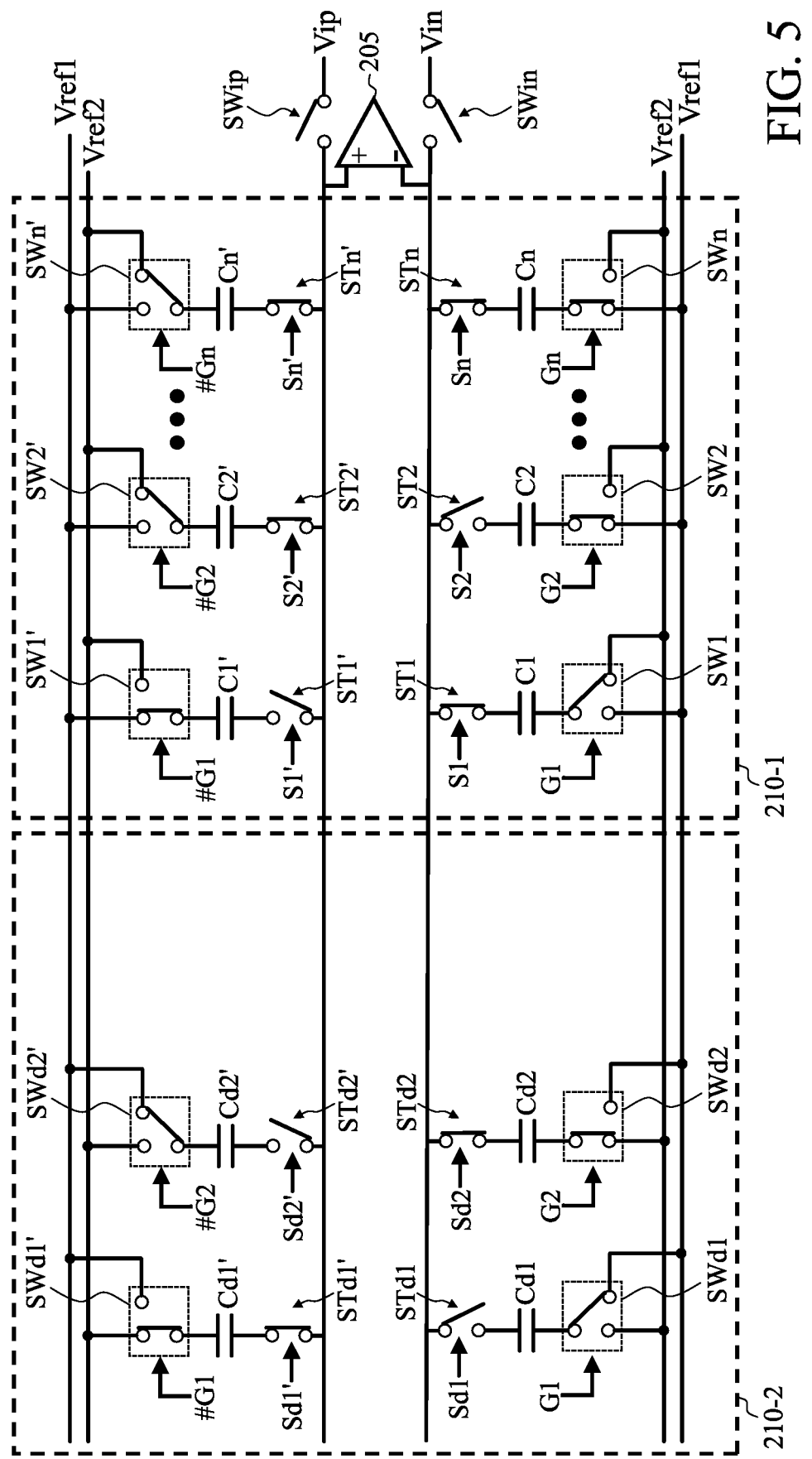
FIG. 5 illustrates an example configuration of the switch-capacitor DAC after the comparison and switching phase finishes.

FIG. 5 shows an example configuration of the switch-capacitor DAC 210 (corresponding to the aforementioned method one) after the comparison and switching phase finishes (i.e., step S450 is positive). Continuing with the foregoing example in which the reference code $b_1 b_2$ is 01 and the reference voltage Vref1 is greater than the reference voltage Vref2, the top plates of the capacitors C1 and Cd1' are respectively coupled to the negative input terminal and the positive input terminal of the comparator 205, the bottom plates of the capacitors C1 and Cd1' are both coupled to the reference voltage Vref2, the top plates of the capacitors Cd2 and C2' are respectively coupled to the negative input terminal and the positive input terminal of the comparator 205, and the bottom plates of the capacitors Cd2 and C2' are both coupled to the reference voltage Vref2. Because the bottom plates of the capacitors C1 and Cd1' are coupled to the same reference voltage, and the bottom plates of the capacitors Cd2 and capacitor C2' are coupled to the same reference voltage, the impedance matching between the positive and negative input terminals of the comparator 205 is excellent. Furthermore, since the capacitors C1, C1, Cd1 and Cd1' correspond to the MSB of the digital code D, and the capacitors C2, C2', Cd2 and Cd2' correspond to the second MSB of the digital code D, the example embodiment of FIG. 5 can significantly improve impedance matching. However, impedance matching can be further improved when the second capacitor array 210-2 contains more capacitors (i.e., when r is closer to n). It is assumed in the example of FIG. 5 that the LSB of the digital code D is logic 1. Note that even if only one bit is implemented (i.e., the second capacitor array 210-2 contains only one pair of capacitors, such as Cd1 and Cd1'), impedance matching can be improved.

Figure 6:
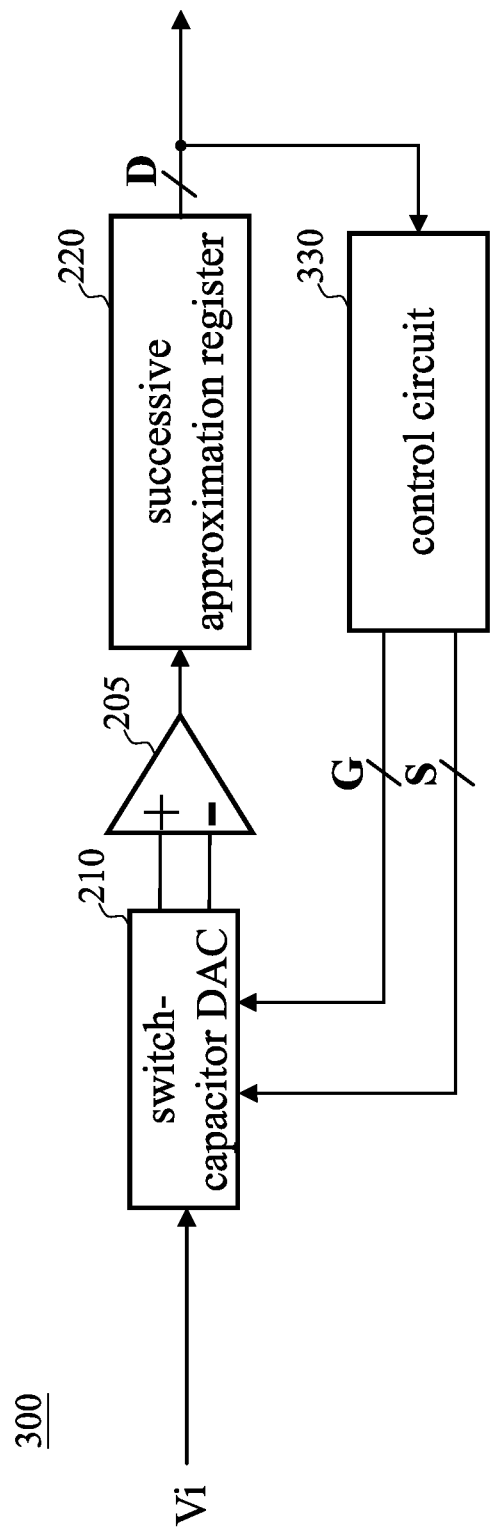
FIG. 6 illustrates a functional block diagram of a SAR ADC according to another embodiment of the present invention.
Figure 7:
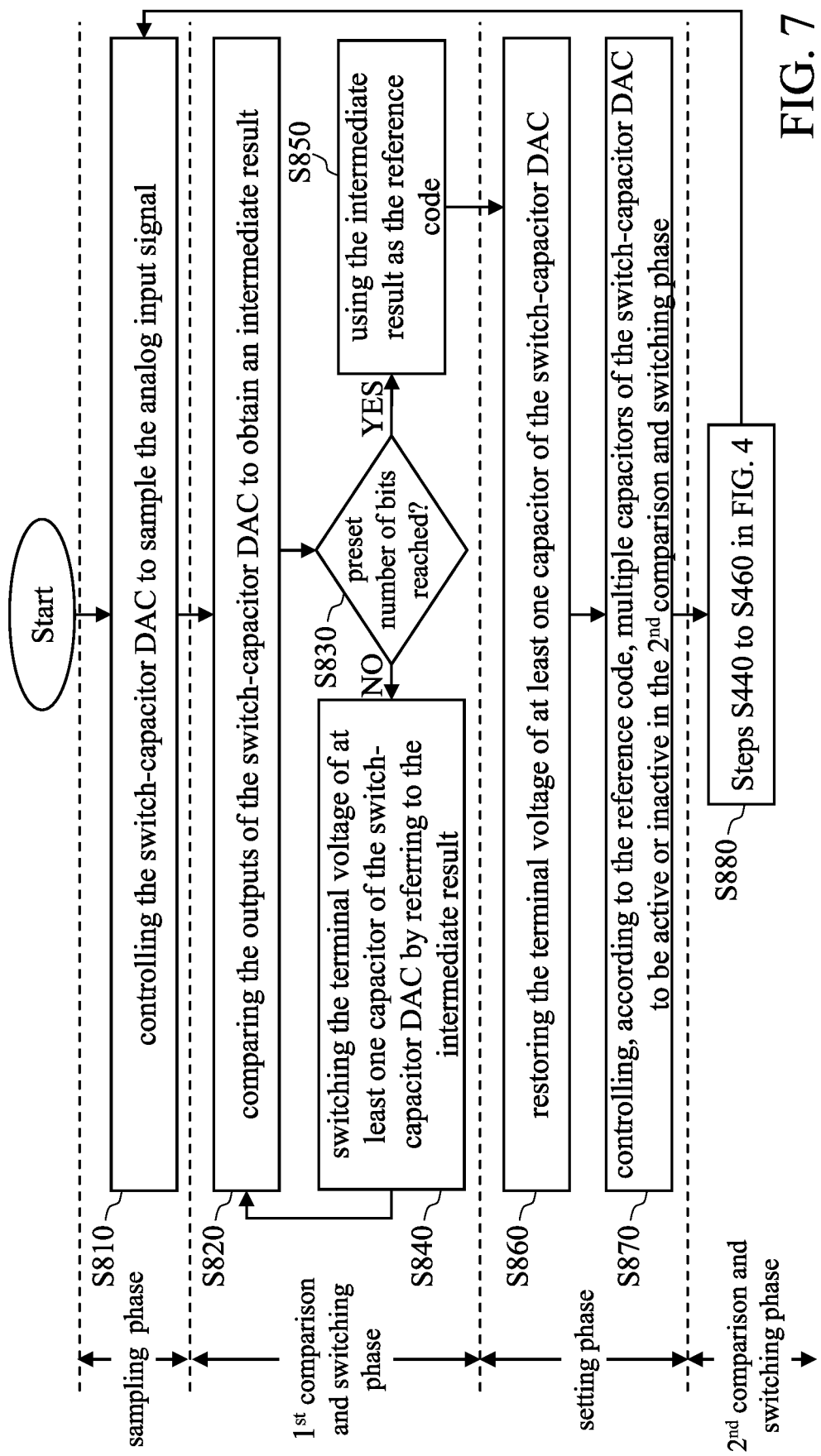
FIG. 7 illustrates a flowchart of an operation method of a SAR ADC according to another embodiment of the present invention.

FIG. 6 is a functional block diagram of a SAR ADC according to another embodiment of the present invention. The SAR ADC 300 includes the comparator 205, the switch-capacitor DAC 210, the successive approximation register 220 and the control circuit 330. FIG. 7 is a flowchart of an operation method of a SAR ADC according to another embodiment of the present invention. Reference is made to FIG. 3 and FIGS. 6 to 7. In the sampling phase, the control circuit 330 controls the switch-capacitor DAC 210 to sample the analog input signal Vi (step S810). This step is the same as step S420, and the detail of this step is omitted for brevity. After the sampling phase finishes, the control circuit 330 controls the switches SWin and SWip to switch off, and then the SAR ADC 300 enters the first comparison and switching phase. In the first comparison and switching phase, after the control circuit 330 controls the switches ST1 to STn and ST1' to STn' to switch on and controls the switches STd1 to STdr and STd1' to STdr' to switch off, the SAR ADC 300 proceeds to perform steps S820 through S850.

Steps S820 and S840 are similar to steps S440 and S460, respectively, except that it is the intermediate result, which contains the bit(s) that has/have been determined in the digital code D, that is obtained in the first comparison and switching phases. In step S830, the control circuit 330 determines whether the number of bits of the intermediate result is equal to a preset number of bits. In one embodiment, this step can be performed by using a counter to count the number of comparisons that the comparator 205 has completed. The preset number of bits is equal to the number of capacitors of one sub-array (i.e., the r value) of the second capacitor array 210-2. In other words, when the first r bit(s) of the digital code D has/have been determined, the result of step S830 is positive. After the intermediate result is determined, the control circuit 330 uses the intermediate result as the reference code (step S850), and then the flow enters the setting phase.

Figure 8:
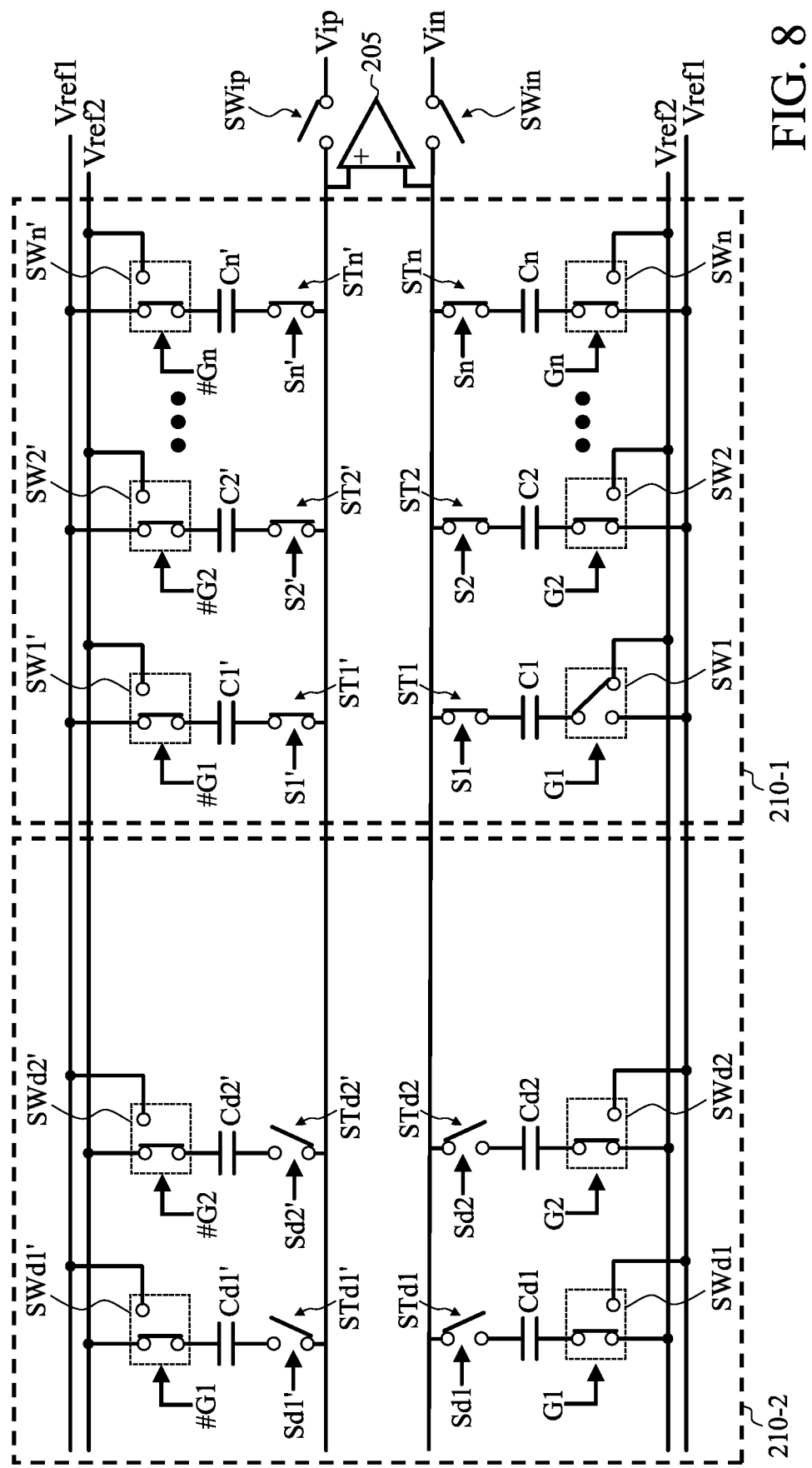
FIG. 8 illustrates an example of the switch-capacitor DAC after the first comparison and switching phase finishes.

FIG. 8 shows an example of the switch-capacitor DAC 210 after the first comparison and switching phase finishes. In this example, r=2, the MSB of the reference code (i.e., the MSB of the digital code D) is logic 0 (if the reference voltage Vref1 is greater than the reference voltage Vref2) or logic 1 (if the reference voltage Vref1 is less than the reference voltage Vref2), and the switch which has been switched in step S840 is the switch SW1 only.

Figure 9:
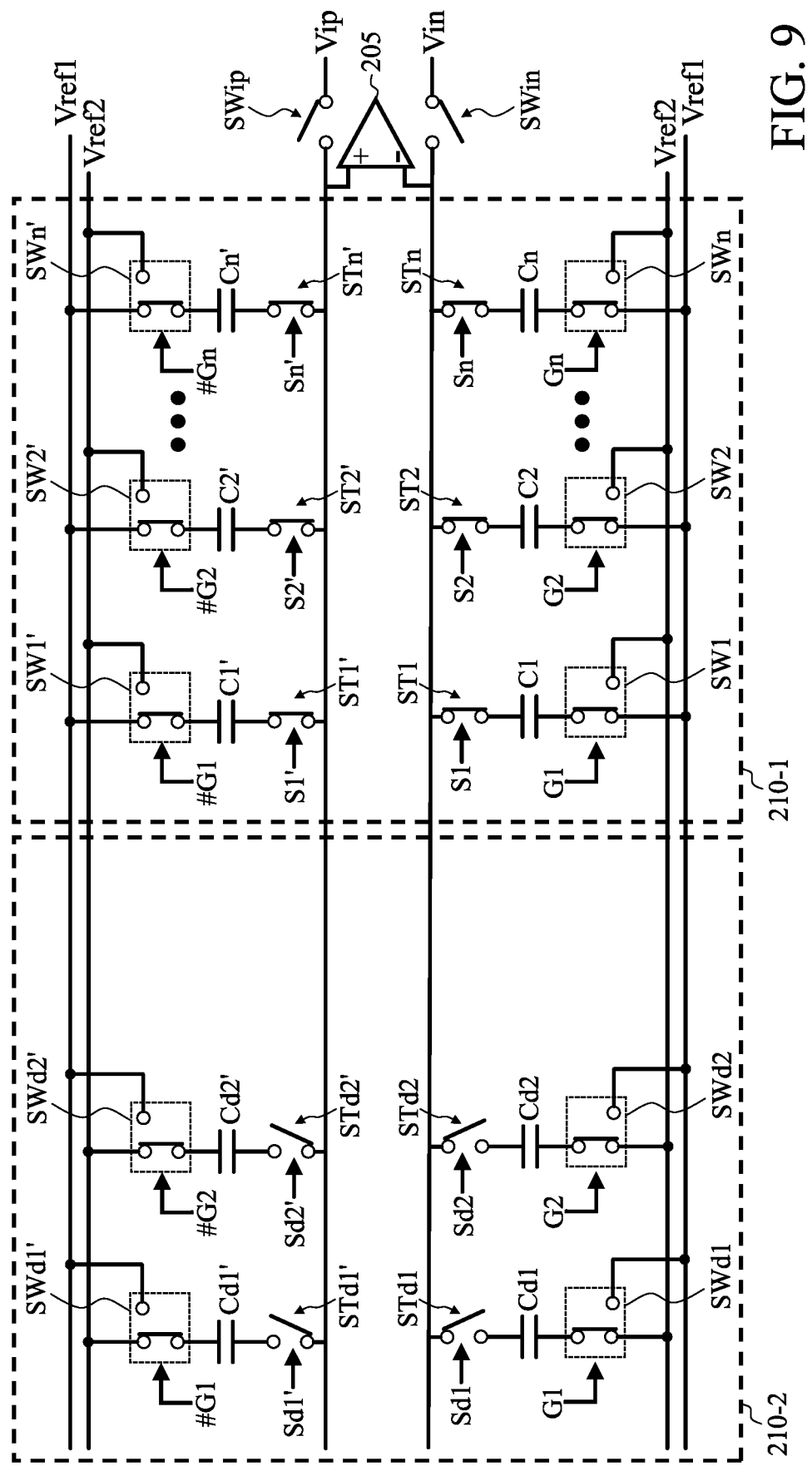
FIG. 9 illustrates an example of the switch-capacitor DAC after step S860 finishes.

In the setting phase, the control circuit 330 restores the switch(es) that has/have been switched in step S840 to the state before switching, that is, restores the terminal voltage of at least one capacitor of the switch-capacitor DAC 210 (step S860). For example, in step S860, with the switches ST1 to STn, ST1' to STn', SWin and SWip remaining in the state of the first comparison and switching phase (i.e., the switches ST1 to STn and ST1' to STn' are on and the switches SWin and SWip are off), the control circuit 330 restores the switch(es) that has/have been switched in step S840 to the state before switching, that is, to the state that the sampling phase has just finished. Continuing with the example of FIG. 8, FIG. 9 shows the circuit configuration after step S860 is completed.

Next, the control circuit 330 controls, according to the reference code, the top plates of multiple capacitors of the switch-capacitor DAC 210 to be coupled or not coupled to the comparator 205 (step S870). Step S870 is similar to step S430, and the detail is omitted for brevity. Step S870 does not change the sampling value because after step S860 is completed, the voltages of the top plates of all capacitors in the first capacitor array 210-1 are restored to the state that the sampling phase has just finished (at this time, the voltages of the top plates of all capacitors in the second capacitor array 210-2 are also in the state that the sampling phase has just finished). In other words, the state of any capacitor of the first capacitor array 210-1 after step S860 has finished is the same as the state of that same capacitor after step S810 has just finished, that is, the bottom plates of the capacitors Ck and Ck' have the same voltage level (i.e., the reference voltage Vref1), the top plate of the capacitor Ck has the same voltage level (i.e., the sampled value of the signal Vin), and the top plate of the capacitor Ck' has the same voltage level (i.e., the sampled value of the signal Vip).

Likewise, upon the setting phase is completed, the bottom plates of the r active capacitors coupled to the positive terminal of the comparator 205 and the bottom plates of the r active capacitors coupled to the negative terminal of the comparator 205 are coupled to the same reference voltage. As a result, the impedance matching between the positive and negative input terminals of the comparator 205 is excellent.

Next, the SAR ADC 300 enters the second comparison and switching phase to obtain a digital code D (step S880). Step S880 is equivalent to steps S440 to S460 in FIG. 4, and so the detail is omitted for brevity. Note that in the embodiment of FIG. 7, in the second comparison and switching phase the control circuit 330 refers to the reference code to continue the determination of the remaining bit(s) of the digital code D that has/have not yet been determined; that is, the control circuit 330 switches the corresponding switch pair(s) (SWj and SWj') according to the reference code before performing step S880).

Figure 11:
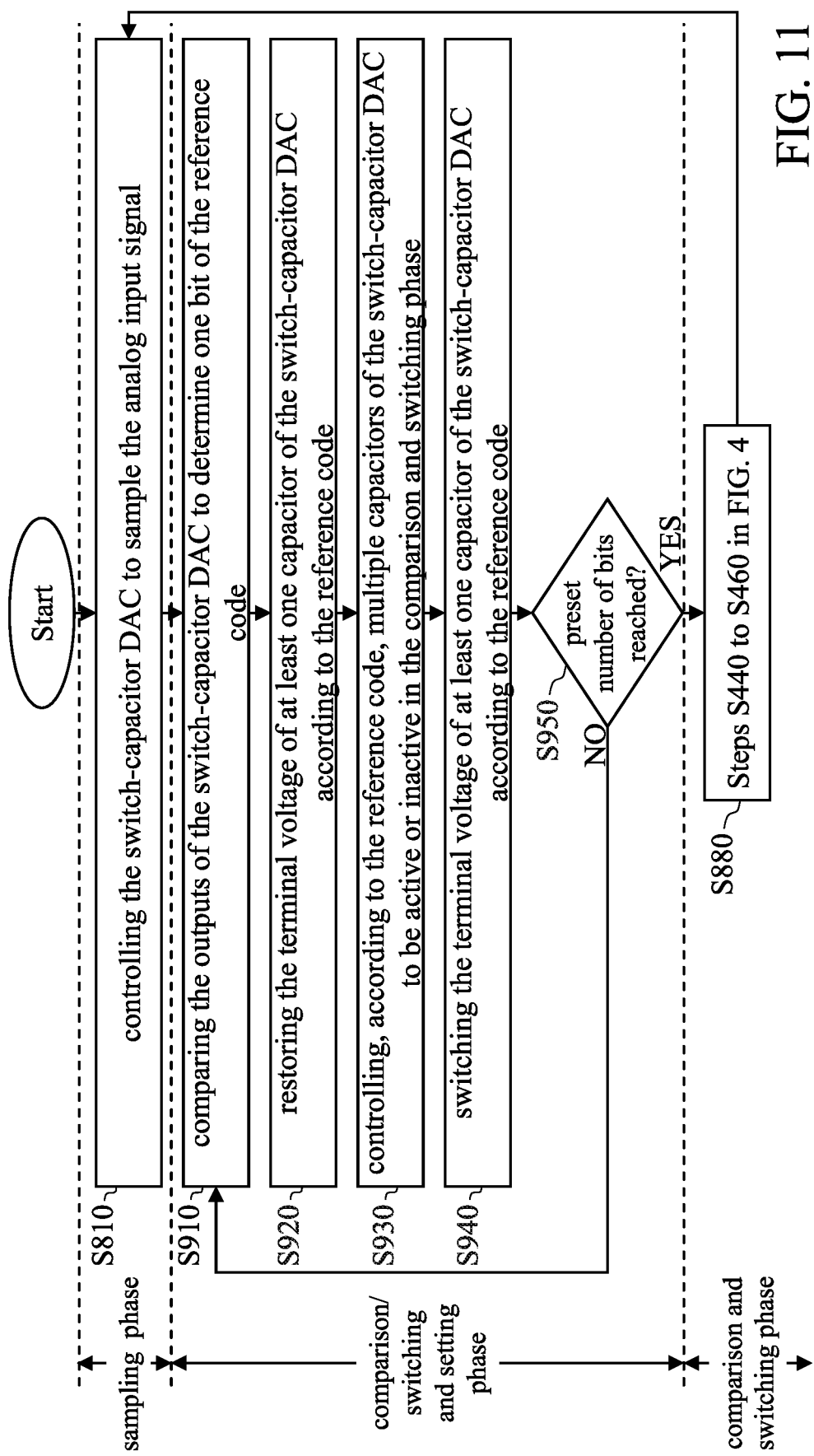
FIG. 11 illustrates a flowchart of an operation method of a SAR ADC according to another embodiment of the present invention.

FIG. 11 is a flowchart of an operation method of a SAR ADC according to another embodiment of the present invention. FIG. 11 is similar to FIG. 7. The sampling phase of FIG. 11 is the same as that of FIG. 7. The comparison and switching phase of FIG. 11 is the same as the second comparison and switching phase of FIG. 7. Further, the comparison/switching and setting phase of FIG. 11 may correspond to the first comparison and switching phase and the setting phase of FIG. 7. In the comparison/switching and setting phase of FIG. 11, steps S920 to S950 are performed each time one bit of the reference code is determined (i.e., step S910). Steps S930, S940 and S950 are respectively similar to steps S870, S840 and S830 of FIG. 7, and, therefore, the details are omitted for brevity.

In step S920, the control circuit 330 restores the switch(es) that has/have been switched in step S940 to the state before switching. In other words, the control circuit 330 can restore the terminal voltage of at least one capacitor of the switch-capacitor DAC 210 according to the reference code. The number of switches that the control circuit 330 restores in step S920 is the same as the number of times that step S940 has been performed, and is also the same as the number of bits of the reference code that have been determined minus one.

Likewise, upon the comparison/switching and setting phase is completed, the bottom plates of the r active capacitors coupled to the positive terminal of the comparator 205 and the bottom plates of the r active capacitors coupled to the negative terminal of the comparator 205 are coupled to the same reference voltage. As a result, the impedance matching between the positive and negative input terminals of the comparator 205 is excellent.

Based on the above disclosure, those having ordinary skill in the art may implement the control circuit 230 and control circuit 330 by using logic circuits, finite state machines (FSMs) or circuits alike.

Since a person having ordinary skill in the art can appreciate the implementation detail and the modification thereto of the present method invention through the disclosure of the device invention, repeated and redundant description is thus omitted. Furthermore, the shape, size, and ratio of any element and the step sequence of any flow chart in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A successive approximation analog-to-digital converter (SAR ADC), which alternately operates in a sampling phase and a comparison and switching phase and is configured to convert an analog input signal into a digital code, comprising:
   a switch-capacitor digital-to-analog converter (DAC), comprising a plurality of capacitors and configured to sample the analog input signal in the sampling phase, wherein the capacitors comprise a first capacitor and a second capacitor, the first capacitor and the second capacitor are substantially the same in capacitance value, and a bottom plate of the first capacitor and a bottom plate of the second capacitor are coupled to different reference voltages;
   a comparator, coupled to the switch-capacitor DAC and configured to compare outputs of the switch-capacitor DAC in the comparison and switching phase to generate a plurality of comparison results;
   a successive approximation register (SAR), coupled to the comparator and configured to store the comparison results, wherein the comparison results constitute the digital code; and
   a control circuit, coupled to the SAR and the switch-capacitor DAC and configured to:
      (A) in the sampling phase, control a top plate of the first capacitor and a top plate of the second capacitor to be coupled to the analog input signal;
      (B) after the sampling phase finishes, refer to a reference code to control the first capacitor to be active in the comparison and switching phase and to control the second capacitor to be inactive in the comparison and switching phase; and
      (C) in the comparison and switching phase, switch a terminal voltage of at least one of the capacitors according to the comparison results.

2. The SAR ADC of claim 1, wherein in step (B) the control circuit controls the top plate of the first capacitor to be coupled to the comparator and controls the top plate of the second capacitor not to be coupled to the comparator.

3. The SAR ADC of claim 1, wherein in step (B) the control circuit controls the bottom plate of the first capacitor not to be floating and controls the bottom plate of the second capacitor to be floating.

4. The SAR ADC of claim 1, wherein the analog input signal comprises a first signal component and a second signal component, and in the sampling phase the control circuit controls the top plate of the first capacitor and the top plate of the second capacitor to be coupled to the first signal component.

5. The SAR ADC of claim 4, wherein the switch-capacitor DAC further comprises a third capacitor and a fourth capacitor, the first capacitor, the second capacitor, the third capacitor and the fourth capacitor have substantially the same capacitance value, the bottom plate of the first capacitor and a bottom plate of the third capacitor are coupled to a first reference voltage in the sampling phase, the bottom plate of the second capacitor and a bottom plate of the fourth capacitor are coupled to a second reference voltage in the sampling phase, and the first reference voltage is different from the second reference voltage.

6. The SAR ADC of claim 5, wherein in the sampling phase, the control circuit controls a top plate of the third capacitor and a top plate of the fourth capacitor to be coupled to the second signal component.

7. The SAR ADC of claim 5, wherein in the comparison and switching phase, the third capacitor is inactive and the fourth capacitor is active, and the bottom plate of the first capacitor and the bottom plate of the fourth capacitor are coupled to the same reference voltage.

8. The SAR ADC of claim 1, further comprising:
   an auxiliary analog-to-digital converter (ADC), coupled to the control circuit and configured to generate the reference code according to the analog input signal.

9. The SAR ADC of claim 1, wherein the comparator compares the outputs of the switch-capacitor DAC before step (B) to obtain a comparison result, and the control circuit is further configured to:
   (E) determine the reference code according to the comparison result.

10. The SAR ADC of claim 9, wherein the control circuit is further configured to:
    (F) between step (E) and step (B), restore the terminal voltage of at least one of the capacitors.

11. A method of operating a successive approximation analog-to-digital converter (SAR ADC), which alternately operates in a sampling phase and a comparison and switching phase to convert an analog input signal into a digital code and comprises a switch-capacitor digital-to-analog converter (DAC) and a comparator, the switch-capacitor DAC comprising a plurality of capacitors, and the capacitors comprising a first capacitor and a second capacitor, the method comprising:
   (A) in the sampling phase, controlling a top plate of the first capacitor and a top plate of the second capacitor to be coupled to the analog input signal, wherein the first capacitor and the second capacitor are substantially the same in capacitance value, and a bottom plate of the first capacitor and a bottom plate of the second capacitor are coupled to different reference voltages;
   (B) after the sampling phase finishes, referring to a reference code to control the first capacitor to be active in the comparison and switching phase and to control the second capacitor to be inactive in the comparison and switching phase;
   (C) the comparator comparing outputs of the switch-capacitor DAC to obtain a plurality of comparison results, wherein the comparison results constitute the digital code; and
   (D) switching a terminal voltage of at least one of the capacitors according to the comparison results.

12. The operation method of claim 11, wherein step (B) comprises:
controlling the top plate of the first capacitor to be coupled to the comparator and controlling the top plate of the second capacitor not to be coupled to the comparator.

13. The operation method of claim 11, wherein step (B) comprises:
controlling the bottom plate of the first capacitor not to be floating and controlling the bottom plate of the second capacitor to be floating.

14. The operation method of claim 11, wherein the analog input signal comprises a first signal component and a second signal component, and in step (A) the top plate of the first capacitor and the top plate of the second capacitor are controlled to be coupled to the first signal component in the sampling phase.

15. The operation method of claim 14, wherein the switch-capacitor DAC further comprises a third capacitor and a fourth capacitor, the first capacitor, the second capacitor, the third capacitor and the fourth capacitor have substantially the same capacitance value, the bottom plate of the first capacitor and a bottom plate of the third capacitor are coupled to a first reference voltage in the sampling phase, the bottom plate of the second capacitor and a bottom plate of the fourth capacitor are coupled to a second reference voltage in the sampling phase, and the first reference voltage is different from the second reference voltage.

16. The operation method of claim 15, wherein in step (A) a top plate of the third capacitor and a top plate of the fourth capacitor are controlled to be coupled to the second signal component in the sampling phase.

17. The SAR ADC of claim 15, wherein in the comparison and switching phase, the third capacitor is inactive and the fourth capacitor is active, and the bottom plate of the first capacitor and the bottom plate of the fourth capacitor are coupled to the same reference voltage.

18. The operation method of claim 11, further comprising:
(E) obtaining the reference code according to an output of an auxiliary analog-to-digital converter (ADC) before step (B).

19. The operation method of claim 11, further comprising:
(E) before step (B), the comparator comparing the outputs of the switch-capacitor DAC to obtain the reference code.

20. The operation method of claim 19, further comprising:
(F) between step (E) and step (B), restoring the terminal voltage of at least one of the capacitors.

* * * * *